(12) United States Patent
Pare et al.

(10) Patent No.: US 10,201,939 B1
(45) Date of Patent: Feb. 12, 2019

(54) PRODUCT AUTHENTICITY VERIFICATION SYSTEM

(71) Applicant: Amazon Technologies, Inc., Seattle, WA (US)

(72) Inventors: Geoffrey Scott Pare, Seattle, WA (US); Daniel Jason Dickinson, Seattle, WA (US); David Echevarria Ignacio, Seattle, WA (US)

(73) Assignee: Amazon Technologies, Inc., Seattle, WA (US)

( * ) Notice: Subject to any disclaimer, the term of this patent is extended or adjusted under 35 U.S.C. 154(b) by 295 days.

(21) Appl. No.: 14/670,360

(22) Filed: Mar. 26, 2015

(51) Int. Cl.
| | |
|---|---|
| *G06K 7/10* | (2006.01) |
| *B29C 67/00* | (2017.01) |
| *G06F 17/50* | (2006.01) |
| *G05B 15/02* | (2006.01) |
| *B33Y 50/02* | (2015.01) |

(52) U.S. Cl.
CPC .......... *B29C 67/0088* (2013.01); *G05B 15/02* (2013.01); *G06F 17/50* (2013.01); *B33Y 50/02* (2014.12)

(58) Field of Classification Search
CPC ............ G06K 19/06; G06K 19/06009; G06K 19/06046; G07F 7/086; G07D 7/00; G07D 7/0006; G07D 7/002; G07D 7/0046; G07D 7/0053
See application file for complete search history.

(56) References Cited

U.S. PATENT DOCUMENTS

| | | | |
|---|---|---|---|
| 7,611,058 B2 * | 11/2009 | Culp ................. | G06K 7/10 235/454 |
| 8,286,236 B2 | 10/2012 | Jung | |
| 8,566,598 B2 * | 10/2013 | Goodman ........... | G06Q 30/06 713/179 |
| 9,740,974 B2 * | 8/2017 | Kumar ............. | G06K 19/06037 |

(Continued)

OTHER PUBLICATIONS

Alba, D., "Secretly Tag 3-D-Printed Objects With InfraStructs," IEEE Spectrum, Aug. 20, 2013, <http://spectrum.ieee.org/video/consumer-electronics/gadgets/secretly-tag-3dprinted-objects-with-infrastructs> [retrieved Mar. 25, 2015], 2 pages.

*Primary Examiner* — Thien M Le
*Assistant Examiner* — April Taylor
(74) *Attorney, Agent, or Firm* — Davis Wright Tremaine LLP

(57) ABSTRACT

A system and method for determining authenticity and authorized possessorship of an item that includes operations of determining a watermark comprised of one or more variations of a set of characteristics integrated into composition of the item, requesting confirmation of authenticity from an authenticity verification service that the determined watermark corresponds to an authentic, registered item, and, in response to the request for confirmation of authenticity, receiving an indication of authenticity of the item and an indication of possessor ship based at least in part on the determined watermark. Further including a system and method for obtaining a blueprint for producing the item, determining the watermark for the item, producing the item with the watermark according to the blueprint, and registering the watermark and at least one authorized possessor of the item with the authenticity verification service of a computing resource service provider.

20 Claims, 7 Drawing Sheets

(56) References Cited

U.S. PATENT DOCUMENTS

| | | | | |
|---|---|---|---|---|
| 2001/0037455 A1* | 11/2001 | Lawandy | ................. | G06K 7/12 |
| | | | | 713/176 |
| 2003/0179902 A1* | 9/2003 | Ambrogio | ............... | G07F 7/086 |
| | | | | 382/100 |
| 2015/0378353 A1* | 12/2015 | Williams | ........... | G05B 19/4183 |
| | | | | 700/119 |
| 2016/0255237 A1* | 9/2016 | Misfeldt | ............ | H04N 1/32325 |
| | | | | 428/201 |

* cited by examiner

PRODUCT AUTHENTICITY VERIFICATION SYSTEM

BACKGROUND

Trademark infringement, counterfeiting, and other intellectual property violations by producers of illegitimate consumer goods is a rampant problem in many parts of the world. Furthermore, the complexity, quality, and variety of products produced through three-dimensional printing and on-demand manufacturing continues to increase. Consequently, as three-dimensional printers become increasingly ubiquitous among consumers, the potential for unlawful replication of authentic products by these devices will also increase. Visually determining whether a product has been unlawfully manufactured or whether an article has been stolen is often difficult, and, therefore, manufacturers and consumers are in need of an efficient system to determine whether a product is authentic and in the possession of its rightful owner or other authorized user.

BRIEF DESCRIPTION OF THE DRAWINGS

Various embodiments in accordance with the present disclosure will be described with reference to the drawings, in which.

DETAILED DESCRIPTION

Figure 1:
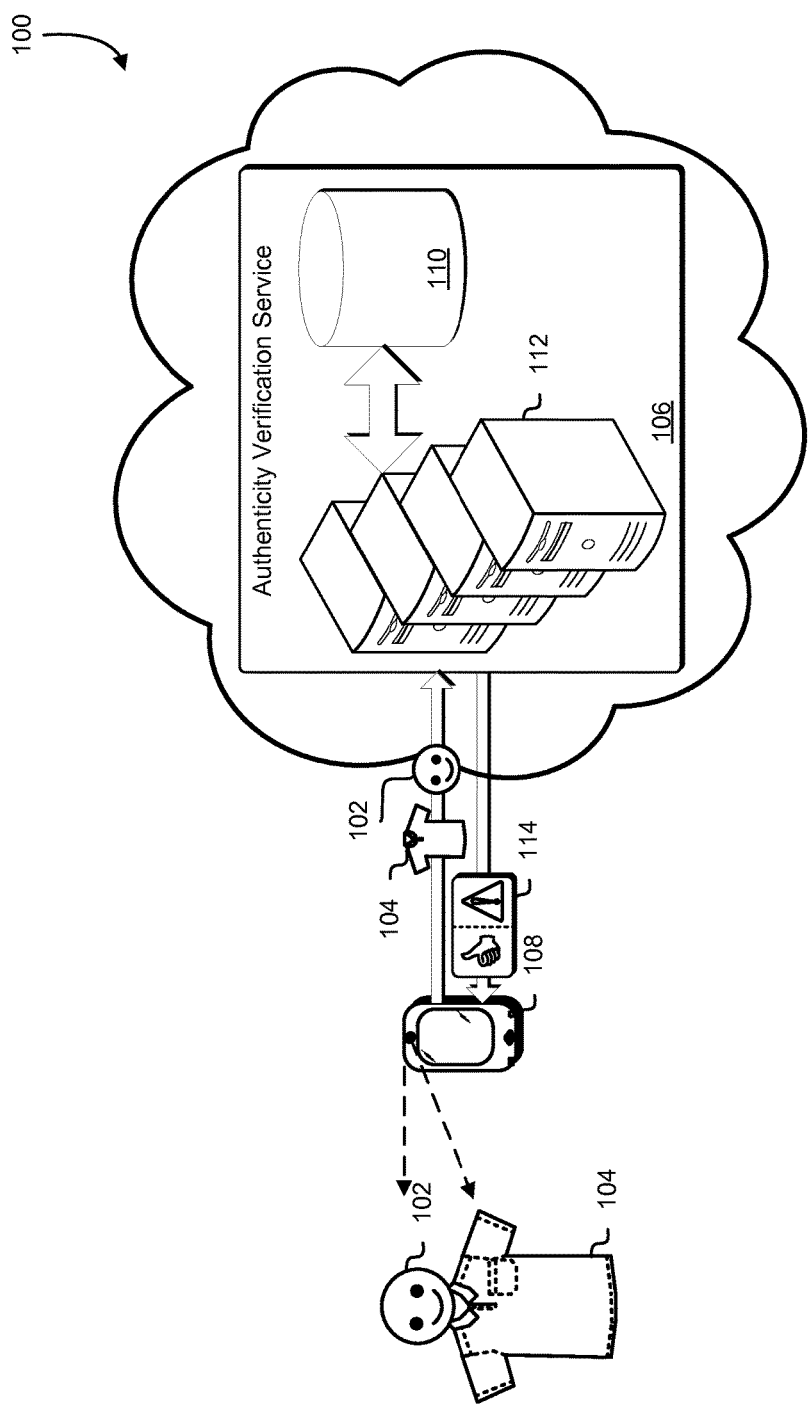
FIG. 1 illustrates an example of scanning a possessor and an item for authenticity verification in accordance with an embodiment.

In the following description, various embodiments will be described. For purposes of explanation, specific configurations and details are set forth in order to provide a thorough understanding of the embodiments. However, it will also be apparent to one skilled in the art that the embodiments may be practiced without the specific details. Furthermore, well-known features may be omitted or simplified in order not to obscure the embodiment being described.

Techniques described and suggested include a system and method for producing an on-demand manufacturing product, such as an object printed with a three-dimensional printer, with an identifying watermark usable to verify authenticity of an item. The system and method include obtaining a blueprint containing instructions for producing the product. The blueprint may additionally contain instructions for producing a watermark for the product that can operate to distinguish the product uniquely from other objects of the same type. The watermark may be effected by varying one or more physical characteristics of the product and may be designed to blend in with the design or construction of the product such that at least a portion of the watermark may not be apparent to an unaugmented human eye.

The particular product may be produced to have the watermark, and the variations of the physical characteristics of the product that make up the watermark may be translated into an item identifier for the particular product. The particular product may then be registered with an authenticity verification service of a computing resource service provider by storing the item identifier in a data store of the authenticity verification service. Additionally, the owner of the particular product and/or other individuals may be registered with the authenticity verification service as being authorized to possess the particular product.

Techniques described and suggested further include a system and method for verifying the authenticity of such products. Such system and method include using a scanning device to obtain product data by scanning the product and providing the product data to an authenticity verification service. Based on the product data, the watermark may be located, and the watermark may be translated to obtain the item identifier for the particular product. If the watermark is unable to be located or translated, it may be because the particular product is not authentic, and the system may perform various actions in such an event (e.g., track the occurrence, notify relevant authorities, send an alert to the scanning device, etc.).

The system and method further includes providing identifying information about the possessor of the product to the authenticity verification service. The authenticity verification service may refer to its data store to determine whether the possessor of the product is authorized to possess the product (e.g., product owner or other individual that has been granted permission to possess the product). If the possessor is an authorized possessor, the system may respond with an indication that the possessor is an authorized possessor of the authentic item. If the possessor is not an authorized possessor of the product, the system may respond with an indication that the product is authentic, but that the possessor is unauthorized to possess it. Note, however, that a valid watermark with an unauthorized possessor may, in some embodiments, indicate inauthenticity of the product, such as when the product was produced using an unauthorized copy of a blueprint for producing the product.

The described and suggested techniques improve the field of product authenticity verification, by providing an authenticity service for registering authentic products produced by on-demand manufacturing devices, verifying the authenticity of such products, and verifying authorized possessors of those products. Additionally, the described and suggested techniques improve the ability of law enforcement and trademark holders to identify and track the source of counterfeit trademark items. Moreover, the described and suggested techniques offer meaningful advantages over other methods by providing a system whereby consumers can verify, using a ubiquitous device, such as a cellular telephone, whether products possessed or sold by other individuals are genuine items.

FIG. 1 illustrates an aspect of an environment 100 in which an embodiment may be practiced. As illustrated in FIG. 1, the environment 100 may include a possessor 102 of an item 104 where there may be a question regarding the item's authenticity (or genuineness). The item and/or possessor may be scanned with a scanning device 108, and data for identifying the item 104 and data for identifying the possessor 102 may be provided to an authenticity verification service 106 of a computing resource service provider. A distributed computing system 112 at the authenticity verification service may analyze the data for identifying the item 104 to determine an identifier that uniquely identifies the item 104 and, if provided, may analyze the data for identifying the possessor 102 to determine, with reference to a data store 110 at the authenticity verification service 106, an identity of the possessor 102. With reference again to the data store 110, the authenticity verification service 106 may determine whether the item 104 is an authentic (also referred to as genuine) item registered with the authenticity verification service 106 and, if the item 104 is an authentic item, may determine whether the possessor 102 is registered as an authorized possessor of the authentic item. A response 114 may be provided to the scanning device 108 reflecting whether the item 104 is recognized and authentic and whether the possessor 102 is registered as authorized to possess the item 104.

Although depicted in FIG. 1 as a shirt, the item 104 may be any item that may be manufactured to have a watermark recognizable by the scanning device 108. Examples of such items include articles of clothing (e.g., shirts, scarves, handbags, eyewear, footwear, jewelry, etc.), figurines, electronics and machine parts (e.g., speakers, prosthetics, gears, etc.), houses, and food. Note that if the item 104 is not manufactured to have a watermark, verification of authenticity by the scanning device 108 may return a message to the effect that the item 104 is not genuine, that the watermark 118 could not be found, that the item 104 is not recognized, or that the item 104 is not an item that can be registered with the authenticity verification service 106.

The possessor 102 may be an authorized owner of the item 104, an individual other than the owner who is authorized to possess the item 104, or an individual that is not registered as being authorized to possess the item 104. If the item 104 contains a watermark recognizable by the scanning device 108, it may be confirmed whether the possessor 102 is registered (i.e., recorded with the authenticity verification service 106) as an authorized possessor of the item 104. In some examples, an "authorized possessor" may refer to an individual who is registered with the authenticity verification service 106 as being authorized to possess the item 104 associated with the identifying watermark on the item 104. There may be one or more authorized possessors for the item 104.

The scanning device 108 may be any type of device configured to scan an item, such as the item 104, for an identifying watermark. Examples of such scanning devices include cellular telephones and other mobile devices, optical scanning devices (e.g., code readers, etc.), wearable technology (e.g., computing devices with optical head-mounted displays, computerized wristwatches, wearable cameras, etc.), cameras, and tablet computers and other computing devices. Other examples of scanning devices include computing systems integrated with or in communication with mounted security cameras and/or mobile (e.g., mounted on an aerial drone) video cameras. In some embodiments, watermarks are optically scannable (e.g., a plaid pattern on a scarf). For such embodiments, the scanning device 108 may have an image sensor or other optical scanning component.

For verifying the genuineness of the item, such an image sensor of this type may capture an image of at least a portion of the item 104 containing the item 104 or otherwise capture identifying data about the item 104 from scanning its watermark. The scanning device 108 may scan the captured image for the watermark to obtain identifying data about the item 104 and upload the identifying data about the item to the distributed computing systems 112 of the authenticity verification service 106 for verification. Alternatively, the scanning device may upload identifying data about the item 104 obtained from scanning its watermark to the distributed computing systems 112 of the authenticity verification service 106. Alternatively, the scanning device may upload at least a portion of the image to the distributed computing systems 112 of the authenticity verification service 106 containing enough of the watermark such that the distributed computing systems 112 may scan the captured image for the watermark to obtain identifying data about the item 104 for verification.

In other embodiments, watermarks include an audible component. For example, the item 104 may emit a particular tone when tapped or struck, or, such as with a speaker, may produce a pattern of sound detectable by a microphone of the scanning device 108 but may be imperceptible to unaugmented human senses because it is outside the frequency range of human hearing. Similarly, the watermark may comprise one or more other electronically detectable components. For example, the item 104 may be produced with a variable combination of materials at least some of whose molecules may be detectible by a set of chemosensors in the scanning device 108, and the watermark may be based at least partially on detected levels of such molecules. Hence, watermarks may be comprised of any of the types of detectable identifying markers (e.g., optically detectable, audibly detectable, molecularly detectable, etc.) or any combination thereof, and consequently, the scanning device 108 may be configured to detect any or all of the types of watermarks described in the present disclosure.

The authenticity verification service 106 may be a service of a computing resource service provider for providing registration and authenticity verification services for products of vendors and trademark holders. For example, a plurality of items may be authorized for production by a trademark holder, but each item of the plurality of items may be produced with a watermark that particularly distinguishes that item from other items of the plurality of items. This distinguishing watermark may then be registered with the authenticity verification service 106 along with an identity of its owner or identities of authorized possessors. In some examples, an "authorized possessor" may refer to an individual who is authorized by the owner of the item 104 and/or by the holder of the item 104 trademark to have the item 104 in his/her possession. As an example, an individual may complete a transaction with a trademark holder to produce the item 104. The individual may consequently be registered with the authenticity verification service as, by virtue of being the owner of the produced item, being an authorized possessor of the item 104. In this example, the individual may also, in agreement with the trademark holder, register one or more members of his/her family (e.g., wife, husband, children, etc.) as also being authorized to possess the item 104. In this manner, the individual and the registered family members may be recognized as authorized possessors when verifying whether the possessor 102 of the item 104 is an authorized possessor.

In some implementations, authorized possessors may be registered as authorized with an expiration date. For example, an authorized owner of an authentic item may lend the authentic item to a neighbor for a week. In such an example, the authorized owner may register (e.g., through an application on a mobile telephone, through a website interface of the authenticity verification service, etc.) the neighbor with the authenticity verification service 106 as an authorized possessor only for the next seven days. Thereafter, the authenticity verification service 106 may consider the neighbor to be unauthorized to possess the item, for example, by deleting or disabling the neighbor from a list of authorized possessors. Additionally or alternatively, in some implementations, possessorship may be accompanying by a duration or expiration date. In such implementations, a possessor may no longer be considered authorized if the current date/time is beyond the date or duration for which the possessor was authorized to possess the item. Thus, the system may have multiple individuals simultaneously registered as authorized to possess the item (e.g., all family members of a household may be authorized to possess the item, or through lending, both the lender and borrower may be authorized possessors, etc.).

In some embodiments, the authenticity verification service 106 tracks a chain of transactions and updated authorized possessors. For example, the item 104 may be sold to a neighbor of the owner, and that transaction (generally, the change in a right to possess) may be recorded by the authenticity verification service 106 (e.g., through an application provided by the authenticity verification service for a mobile device of the initial authorized owner, etc.) and the neighbor may be updated as the new authorized possessor. Later, the neighbor may donate the item 104 to a thrift store, which may then be updated as the authorized possessor (e.g., through a computer or terminal at the thrift store in communication with the authenticity verification service), and the previous owner may be removed, disabled, or deleted from the list of authorized possessors. Still later, the thrift store may sell the item 104 to another party, who may then be recorded as the new owner/authorized possessor of the item 104.

The data store 110 may be a database of the authenticity verification service configured to store registration information for authentic, authorized items. Such registration information may include information such as watermark information for uniquely identifying the item 104, the type of item, an identity of an on-demand manufacturing device used to produce the item 104, a timestamp indicating the time at which the item 104 was produced and/or registered, location information indicating a location where the item 104 was produced, and other such information. The data store 110 may also be configured to store registration information about authorized possessors of such authentic, authorized items. The data store 110 may also be configured to track chains of ownership/possession (e.g., when an authorized item is traded, gifted, or sold to new authorized possessors).

The distributed computing system 112 may comprise multiple computer systems and services working in concert to provide an authenticity verification service for customers of a computing resource service provider. In some cases, the distributed computing system 112 may be configured to receive input and provide output through one or more interfaces, such as application programming interfaces for registering items, registering authorized possessors, verifying items and/or possessors, and tracking chains of ownership/possession, to the customers of the computing resource service provider. The distributed computing system 112 may be in communication with the data store 110, and may provide the aforementioned registration and chain of ownership/possession information to the data store 110 for storage and may make requests to the data store 110 to retrieve the stored information.

The response 114 may be a response provided to the scanning device 108 from the distributed computing system 112 as a result of a request from the scanning device 108 to verify the authenticity of the item 104 and/or the authorized possessor of the item 104. In some embodiments, such a response includes data received by the scanning device 108 that indicates, in the positive, statuses to the effect that, the item is genuine, the item is owned by Person A and/or Person A is authorized to possess an item that matches the genuine item. In the negative, the response may be data received by the scanning device 108 that indicates statuses to the effect that, the item is not genuine, the item could not be recognized as a registered item, unable to locate/decipher a watermark on the item, the possessor is not recognized, and the possessor is not an authorized possessor of the item. In some embodiments, where the possessor is not recognized as an authorized possessor of the item 104, is recognized as a known unauthorized possessor of the item 104 (e.g., a thief of the item 104), or the item 104 is recognized as a forgery (e.g., item 104 produced without permission or an unauthorized copy of the item 104), the authenticity verification service 106 may be configured to additionally send an alert to appropriate authorities (e.g., police, the trademark holder, customs, etc.). In other embodiments, the scanning device 108 is configured to send such alerts instead of the authenticity verification service 106.

Statuses and messages may be relayed to the bearer of the scanning device 108 in a variety of ways, including audible messages, audible beeps and tones, message windows, text messages, e-mails, and graphical indicators. For example, a heads-up display of a wearable computing device may update its screen with augmented reality (e.g., text or graphic overlays) indicating whether the item is or is not genuine and/or whether the possessor is or is not an authorized possessor. As a more specific example, a scanned handbag may appear to glow golden on the display screen if it is confirmed to be genuine, or may appear red and blinking if it could not be confirmed to be genuine.

In still other embodiments, the authenticity verification service 106 tracks detection of genuine and not genuine items, but may not send any alerts. This information may later be offered by the authenticity verification service 106 to the trademark holders or other customers for marketing purposes. For example, over a particular period, the authenticity verification service 106 may track many counterfeit red handbags of a particular brand. The company owning the particular brand may find value in learning that those particular red handbags are in high demand and may adjust marketing and/or pricing strategies to combat counterfeiters and sell additional genuine red handbags. Similarly, the company may learn that, even though it sold a large number of genuine green handbags, that only a low number of them have actually been seen in public, and, based on the information, the company may perform additional research to determine why its customers are leaving their green handbags at home.

In some embodiments, the authenticity verification service 106 provides information to authorized requesting parties about who has been registered with a particular item. For example, the authenticity verification service 106 may act as a registration database for owners and possessors of firearms that have been produced with a three-dimensional printer. As an alternative example, a bowling ball vendor may obtain a list of registered possessors of a particular brand of bowling bag in a particular area for purposes of marketing their line of bowling balls to the possessors.

In some implementations, the authenticity verification service may keep track of (i.e., count) how many different unauthorized possessors a particular item has been detected in the possession of Such detection may indicate that unauthorized copies of a particular item are being made, and if the count of unauthorized possessors for the particular item exceeds a threshold, the authenticity verification service may notify law enforcement to investigate the registered owner of the particular item to determine the source of the probably unauthorized copies.

Similarly, if a particular watermark is known to be associated with unauthorized copies (i.e., counterfeit) items (for example, if customs officials seize a crate of counterfeit items with the same watermark, or if an item or blueprint with a particular watermark is reported as stolen), the authenticity verification service can be notified (e.g., through a website interface) and caused to tag the watermark as being void or associated with stolen items. Such items, including the original, when scanned thereafter, may cause the authenticity verification service to alert appropriate authorities (e.g., customs, trademark holder, bearer of the scanning device) that the items are associated with illegal activities (i.e., unauthorized reproduction of the item).

As noted, in some embodiments, analysis of the watermark to obtain identifying data for the item 104 is performed by the scanning device 108. In other embodiments, such analysis of the watermark is performed by computing systems of the authenticity verification service 106. In this manner, verification may take advantage of remote compute power while minimizing resource usage of the scanning device 108. Also as noted, in some embodiments, the scanning device 108 is configured to notify proper authorities (e.g., police, the trademark holder, owner, authorized possessor, etc.) when counterfeit items or unauthorized possessors are detected. In some alternative embodiments, the authenticity verification service 106 is configured to notify the proper authorities. In still other embodiments, the scanning device 108 and/or authenticity verification service 106 is only configured to notify the user of the scanning device 108 whether the item 104 is authentic and/or whether the possessor 102 in an authorized possessor.

As noted, the scanning device 108 may, as its notification, implement various graphics and/or text on a display screen of the scanning device 108. Additionally, or alternatively, the scanning device 108 may send a notification message as a text message, an e-mail, or message in a popup window. Additionally or alternatively, the scanning device 108 may tag a captured image of the item 104 and its possessor 102 with one or more labels (e.g., such as, "Person A with a genuine Company X handbag!" with an arrow pointing to the item). The scanning device 108 may subsequently allow the tagged image to be uploaded to one or more social media Internet sites for friends of Person A to marvel at.

As an example of use of the present embodiment, Person A sees a friend, Person B, carrying a product with a well-known trademark of Company X. Person A wishes to confirm that the trademarked product is really a genuine product of Company X, and captures an image of the product with a scanning device (e.g., a mobile telephone with a built-in camera) and uploads the image to the authenticity verification service 106. The authenticity verification service 106 determines a watermark from the uploaded image, determines the identity of the product from the watermark, performs its verification operations, and responds to the scanning device. In one scenario, the scanning device might respond with, "The product is a genuine Company X brand product." In another scenario, the scanning device might respond with, "The product is not a real Company X product."

In still another scenario, the scanning device might respond with an identity of the authorized possessor, such as, "This product is registered to Person C." In some cases, the scanning device 108 and/or authenticity verification service 106 may be unable to differentiate between an original product and an exact copy (i.e., that exactly reproduces the watermark 118 of the original product). In such a case, the exact copy would still be identified as being registered to the owner/possessor of the original product. In this manner, investigations into locating the distribution source of unauthorized products may be aided. Likewise, if the original product is stolen, the original product may be scanned and the original owner/possessor determined. In this manner, recovery of stolen property may also be aided.

Items produced by three-dimensional printers (i.e., printers that fabricate three-dimensional objects), computerized sewing machines, and other on-demand manufacturing devices may appear to be of such high quality that they may not be easily distinguishable from the genuine articles they appear to be. For example, a counterfeit item may be produced on a consumer on-demand manufacturing device in the home of an individual and may even be produced to include a well-known name brand/trademark on the item. The counterfeit item may be of such high quality that a human and/or untrained eye may be unable to discern which item is the genuine one and which is counterfeit. As another example, some manufacturers or trademark holders may provide consumers with blueprints for producing authorized articles with consumer on-demand manufacturing devices. However, such blueprints may be stolen and/or used to produce exact copies of the authorized articles in excess of what was intended by the manufacturer or trademark holder.

Figure 2:
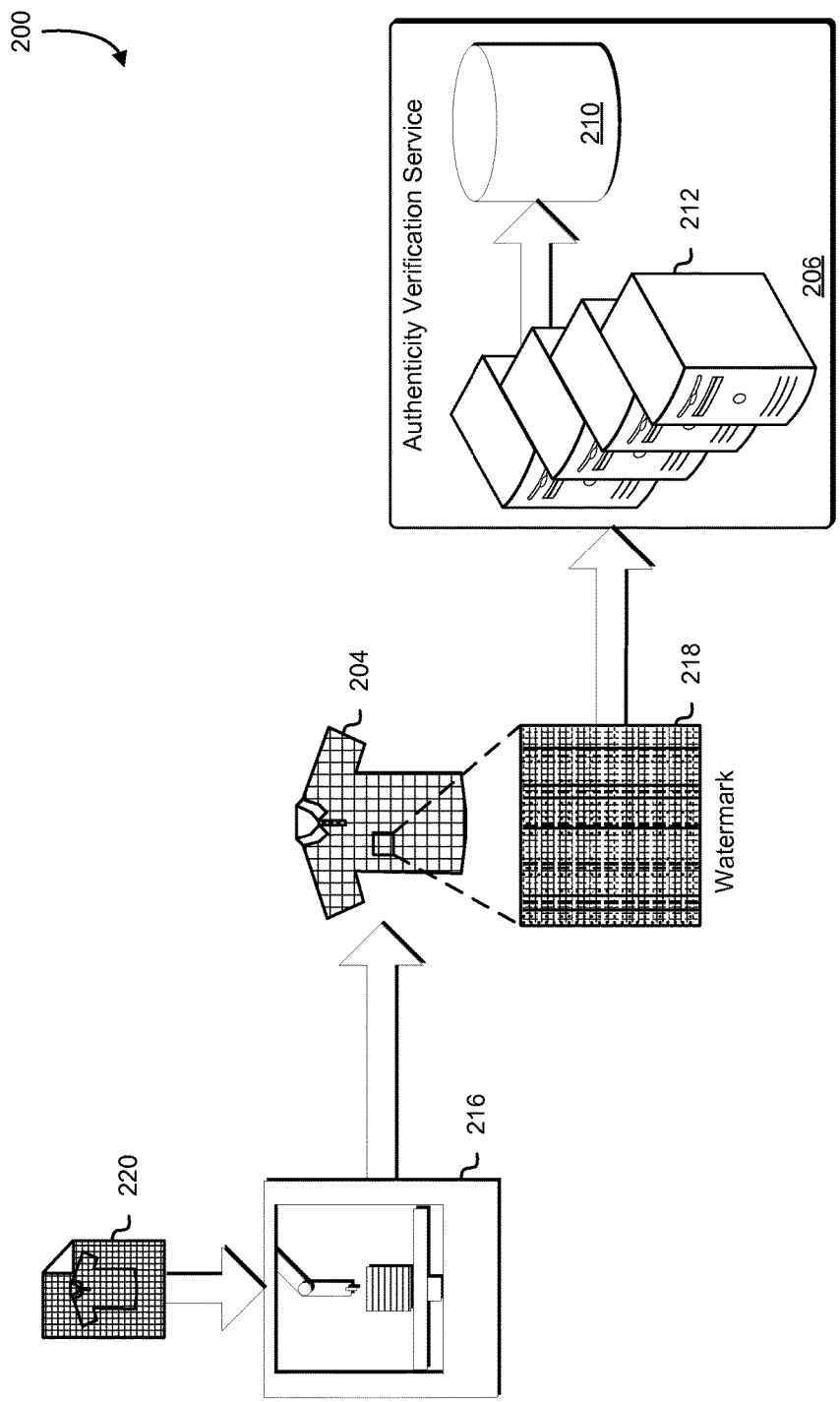
FIG. 2 illustrates an example of producing a particular item with a watermark in accordance with an embodiment.

FIG. 2 illustrates an aspect of an environment 200 in which an embodiment may be practiced to ensure that authorized articles may be registered and identified as genuine. As illustrated in FIG. 2, the environment 200 may include an on-demand manufacturing device 216 which may be used to produce a particular item 204 according to a blueprint 220 or other instruction. The on-demand manufacturing device 216 of the present disclosure may itself be configured, through hardware or software, to produce a watermark 218 unique to the particular item 204 or may be caused to produce the watermark 218 by instructions in the blueprint 220. The watermark 218 may be registered in a data store 210 of an authenticity verification service 206 by either the on-demand manufacturing device 216 or the trademark holder providing data describing the watermark 218 to distributed computing systems 212 of the authenticity verification service 206. In some implementations, registration of the watermark 218 may include a digital signature, such as a digital signature of the on-demand manufacturing device 216, which may confirm that the watermark 218 is being registered by an authorized device.

The blueprint 220, which may also be referred to as a three-dimensional (3D) model, may be a file in electronic format configured to instruct the on-demand manufacturing device 216 on how to produce the particular item 204 and its watermark 218. In many cases, the blueprint 220 may be generated by a product vendor or trademark holder for a trademark of the particular item 204, and may be made available to customers for free or upon completion of a purchase transaction for the particular item 204. The blueprint 220 may be provided to the on-demand manufacturing device 216 by such a customer through transmission of the blueprint 220 from a computing system through a network or direct connection, or may be provided to the on-demand manufacturing device 216 through computer-readable media, such as a universal serial bus flash drive.

In some embodiments, the blueprint 220 may be generated by the product vendor or trademark holder with the watermark 218 information specific to the particular item 204 already pre-registered with the authenticity verification service 206 prior to receipt of the blueprint 220 by the on-demand manufacturing device. In other embodiments, the blueprint 220 contains instructions for generating the watermark 218 specific to the particular item 204, and the watermark 218 information may be registered with the authenticity verification service 206 (e.g., by the on-demand manufacturing device 216) at a time when or after the particular item 204 is produced. In still other embodiments, the on-demand manufacturing device 216 itself is configured to generate the watermark 218 specific to the particular item 204 and register the watermark 218 information with the authenticity verification service 206.

The on-demand manufacturing device 216 may be a device configured to produce one or more items of the types of the item 204. Examples of such a device includes a three-dimensional printer, a computerized sewing machine, a computerized loom or other computerized textile-producing machine. Materials usable by the on-demand manufacturing device 216 to produce the item 204 may include one or more of plastics and polymers (e.g., acrylonitrile butadiene styrene, polylactic acid, polyvinyl alcohol, polycarbonate, high density poly ethylene, etc.), metals (e.g., steel, aluminum, titanium, gold, silver, etc.), ceramics, paper, plaster, wood, organic (e.g., tissue, cells, etc.), food (e.g., chocolate, gelatin, milk, fruit puree, sodium alginate, etc.), natural fibers (cotton, linen, silk, wool, hemp, etc.), synthetic fibers (polyester, nylon, rayon, etc.), concrete, and composites. The on-demand manufacturing device 216 may be configured to receive and interpret the blueprint 220 in order to produce the particular item 204 and the watermark 218. In some cases, the on-demand manufacturing device 216 may be configured to communicate to the distributed computing systems 212 of the authenticity verification service 206, such as through the Internet or other network, in order to register the particular item 204 (and its watermark 218) with the authenticity verification service 206 as an authentic item.

In some embodiments, the on-demand manufacturing device 216 has its own identifier that distinguishes it from other on-demand manufacturing devices. In these embodiments, watermarks may be generated based on a combination of an identifier for the particular item 204 and the on-demand manufacturing device 216 identifier. In this manner, the on-demand manufacturing device 216 used to produce the particular item 204 may be determined from the watermark 218. Additional information may also be encoded into the watermark 218, such as a location (e.g., obtained from global positioning system location information or other location information) indicating a location where the particular item 204 was produced and/or timestamp representing a time when the particular item 204 was produced and/or registered.

As with item 104 of FIG. 1, the particular item 204 may be any type of item that may be manufactured/produced to have a watermark or other identifying characteristic that distinguishes the particular item 204 from all other items. For example, though depicted in FIG. 2 as an article of clothing, the particular item 204 could be any of a variety of items, including a statue, a toy, office equipment (e.g., stapler, tape dispenser, etc.), vehicle part, orthopedic cast, piece of artwork, dining flatware, phonograph record, and audio component (e.g., headphones, speakers, etc.).

As with the authenticity verification service 106 of FIG. 1, the authenticity verification service 206 may be a service provided by a computing resource service provider to trademark holders and their customers for registering and verifying authentic items. For example, trademark holders may subscribe to the authenticity verification service 206, which may then permit authentic products of the trademark holder to be registered with the authenticity verification service 206. Other individuals may be provided application programming interfaces for communicating to the distributed computing systems 212 of the authenticity verification service 206. For example, customers of the trademark holder and/or the authenticity verification service 206 may communicate registration information to the authenticity verification service 206, such as through an application programming interface accessible via the on-demand manufacturing device 216, for registering particular items produced.

In some embodiments, if the particular item 204 or its blueprints are stolen, the owner of the particular item 204 or blueprints may be able to, through an application programming interface of the authenticity verification service 206, report the theft of the particular item 204 or blueprints. Thereafter, if the authenticity verification service 206 is ever requested to verify the authenticity of the particular item 204, the authenticity verification service 206 may respond indicating that the particular item 204 is stolen or may perform other appropriate action (e.g., notifying law enforcement, tracking the time, place, and location, etc.). In some implementations where the particular item 204 is reported by its owner as being lost or stolen, the trademark holder or the authenticity verification service 206 may issue or authorize the creation of a new watermark and/or blueprints for the owner such that the owner can produce a replacement for the lost or stolen particular item.

Other users may subscribe to the authenticity verification service 206 and be allowed to download applications for mobile devices for them to operate as a scanning device for scanning items, such as the scanning device 108 of FIG. 1. As noted, the particular item 204 and its authorized possessors may be registered by storing such registration information in the data store 210 of the authenticity verification service 206. The data store 210 comprise a database or set of files on one or more computer-readable media drives and, in some implementations, may be distributed over multiple computer systems of the authenticity verification service 206. The watermark may be directly or indirectly registered in association with one or more authorized possessors. For example, the watermark 218 may be directly registered in the data store 210 in a one-to-one relationship with the particular item 204, and the watermark may be indirectly associated in a separate table of the data store 210 in a one-to-many relationship with one or more authorized possessors. The data store 210 may also track information about the chain of ownership/possession of the particular item 204 (e.g., who the particular item was bought, lent, leased, gifted, from and/or to, etc.).

The watermark 218 may be constructed to uniquely identify the particular item 204. That is, no two items should have the same watermark. The watermark 218 may be constructed such that a scanning device, such as the scanning device 108 of FIG. 1, may scan the watermark 218 and decode the scanned data into a format that can be matched to the particular item 204 registered with the authenticity verification service 206 in the data store 210. For example, the colored threads of an article of clothing may be scanned vertically and/or horizontally in a similar manner as a barcode reader scans a barcode. That is, different colors of threads, spacing between certain threads or thread colors, thread thicknesses, thread combinations, thread weave (e.g., how threads/fabrics are intertwined, spaced, etc.), thread reflectivity, stitch lengths, stitch spacing, and stitching patterns, whether threads are horizontal, vertical, or at particular angles to other threads. However, even if watermarks of two items of the same type are compared and differences are found, the watermarks may not be readable to an individual; that is, the meaning behind the differences (i.e., how the differences translate to different values for the item identifiers in the data store 210) may not be apparent.

Additionally or alternatively, the watermark 218 may comprise particular or special filaments. These filaments may be detectable under certain lighting conditions and may be designed to be detectable by a scanning device such as the scanning device 108 of FIG. 1. For instance, the watermark may include one or more features that are only detectable under ultraviolet or infrared light spectra. In order to capture these features for verifying the authenticity of the particular item 204, the scanning device may be configured to project ultraviolet or infrared light, as needed, to capture these unique features of the particular item 204. All of these examples may represent different values, or various combinations of the above may represent different values. As an example, a thin, vertical, red thread located between two thicker white threads may represent a value of thirty. Similarly, a blue thread that intersects the red thread at a forty-five degree angle and at a point five millimeters below a horizontal green thread may represent a value of four. Taken together, the two threads may represent a value of thirty-four in an identifier for the item having the watermark.

Furthermore, in many embodiments, the watermark 218 is constructed not to be readily distinguishable as a watermark by human senses. That is, the watermark 218 itself may be a design integrated as part of the look of the particular item 204. As another example, the watermark 218 may be integrated into a portion of a design of the particular item 204 (e.g., a section of the particular item 204 may have threads that are positioned and/or colored such that they blend into the design of the particular item). Without comparing the particular item with another particular item, it may not be readily apparent to an individual where the watermark 218 is or what characteristics are part of the watermark 218. Furthermore, even if two items of the same type are compared and differences in characteristics concerning their watermarks are found (e.g., a distance between a white thread and a red thread on a first item is farther than on those equivalent threads on the second item), the meaning behind the differences (i.e., how the differences translate to different values for the item identifiers associated with the particular items in the data store 210) may not be apparent. However, such differences may be detected and translated by a scanning device or authenticity verification service. Thus, in this manner, even variations of characteristics that may be perceptible to an unaugmented human eye may still be unreadable by an individual but readable by a computing device.

In other words, the watermark may be effected (or effectuated) by variations of one or more physical characteristics (e.g., size, color, spacing, dimensions, thickness, etc.) of materials integral to or integrated into the composition (e.g., arrangement, configuration, structure, design, appearance, etc.) of the item. In other words, the on-demand manufacturing device 216 can produce a different watermark for each item it manufactures by varying, in one or more ways, any of a variety of physical characteristics of the item in such a way that the watermark 218 appears to be a constituent part of the design or structure of item itself. Additionally or alternatively, the particular item 204 may have a watermark that is comprised of audio characteristics (e.g., a unique tone when tapped or struck). The watermark 218 may have regions of one or more colors that are near in the color spectrum to one or more other colors of the particular item 204 such that, the regions of one or more colors appear to the human eye to be the same color as the one or more other colors, but to a scanning device are distinguishable. The watermark 218 may also be a combination of any of the aforementioned. The watermark 218 for each different particular item may be varied such that no two watermarks 218 are the same. In these embodiments, the watermark 218 should still be detectable through analysis of data, such as by a scanning device or computing systems of the authenticity verification service 206, obtained by a scanning device.

Other factors that may be used in a watermark include designs and patterns (e.g., a particular arrangement of paisley, pictograms, hieroglyphs, fleur-de-lis shapes, plaid patterns, etc.), shapes (e.g., circles, ovoids, triangles, squares, hexagons, rectangles, irregular shapes, etc.) and other shape information properties (e.g., size, color, number of edges, lengths of edges, rotational symmetry, etc.), volume, height, width, and length. The watermark 218 may be designed such that a scanning device, such as the scanning device 108 of FIG. 1, may be able to recognize the watermark 218 from a variety of angles, orientations, and perspectives. For example, there may be detectible markings for each watermark that may be used (e.g., positional relationship of the markings to each other, whether certain markings appear larger than other markings (indicating proximity to the scanning device), etc.) to determine the correct orientation of the watermark 218. Error correction, such as Reed-Solomon error correction, may then be applied to the watermark 218 until the watermark 218 may be correctly interpreted.

Colors having significance in a watermark may not be limited to colors or combinations of colors of the visible spectrum. For example, an identifier for the particular item 204 may be derived based at least in part on infrared and ultraviolet colors of components of the particular item. Likewise, thermal properties of the item may be detectible by a scanning device in a manner significant to the watermark 218. For example, materials in a piece of clothing may look the same but may, in fact, have different thicknesses and/or thermal insulative properties, such that when worn, body heat of the wearer may be emitted in patterns not perceptible (e.g., not visible) with the unaugmented human eye but may be discernable with a scanning device that can detect infrared. In some examples, "unaugmented" human senses may refer to human vision (sight), auditory perception (sound), olfaction (smell), gustation (taste), and tactile perception (touch) without aid (e.g., magnification, filtering, signal processing, image processing, etc.) from external or internal devices (e.g., optical lenses, ear trumpets, electronic devices, magnetic implants, etc.). In some examples, the quality of being "imperceptible" to unaugmented human senses may refer to elements that are beyond the limits of being sensed by such unaugmented human senses (e.g., sounds at levels too low to hear, frequencies outside the range of human hearing, marks too small to distinguish with the naked eye, differences in thickness too small to distinguish with the naked eye, ultraviolet and infrared spectra, different colors that appear to be identical to the human eye, etc.). Similarly, the polarization of light emitted or reflected from portions of the watermark may have significance.

Furthermore, there may be different color shades so close to each other as to be indiscernible to the human eye, but may be distinguishable (e.g., as infrared patterns) by a scanning device, such as the scanning device 108 of FIG. 1, and may be used in the watermark 218. For example, a series of threads may appear to the human eye to be the same color of red thread, but may, in fact, differ in shade to a degree detectable by the scanning device and the detectible differences may be used to determine the unique value of the watermark.

The watermark may, in whole or in part, include characters, glyphs, or other shapes that are imprinted, etched, impressed, or intermingled with the particular item 204 in a manner too small to be readable with the unaided/unaugmented human eye (e.g., without a magnifying glass, microscope, or electronic device) but may be readable by a scanning device, such as the scanning device 108 of FIG. 1. The watermark may be a quick response code, series of alphanumeric characters or other glyphs, or a barcode on a tag or area of the particular item 204. In some cases, the watermark may comprise a naturally occurring pattern of a material used in the construction of the particular item 204. For example, the pattern of quill follicles in ostrich leather, texture of leather, or a pattern of wood grain in products that contain any of those materials may act as a "fingerprint" for the product and may be used to uniquely distinguish the product from other products.

Note too that the watermark need not only have optical properties. For example, a speaker may have, as at least a portion of its watermark, unique audible characteristics, such as emitting certain sounds during operation that are outside the frequency range audible to the human ear. Another example that may be used as a watermark or as a component of a watermark is acoustic resonance. For example, an acoustic resonance frequency of an item may be affected by the types and arrangement of materials in the construction of the particular item 204, and these types and arrangement of materials may be varied to vary a certain frequency emitted by the particular item 204 when tapped.

Figure 3:
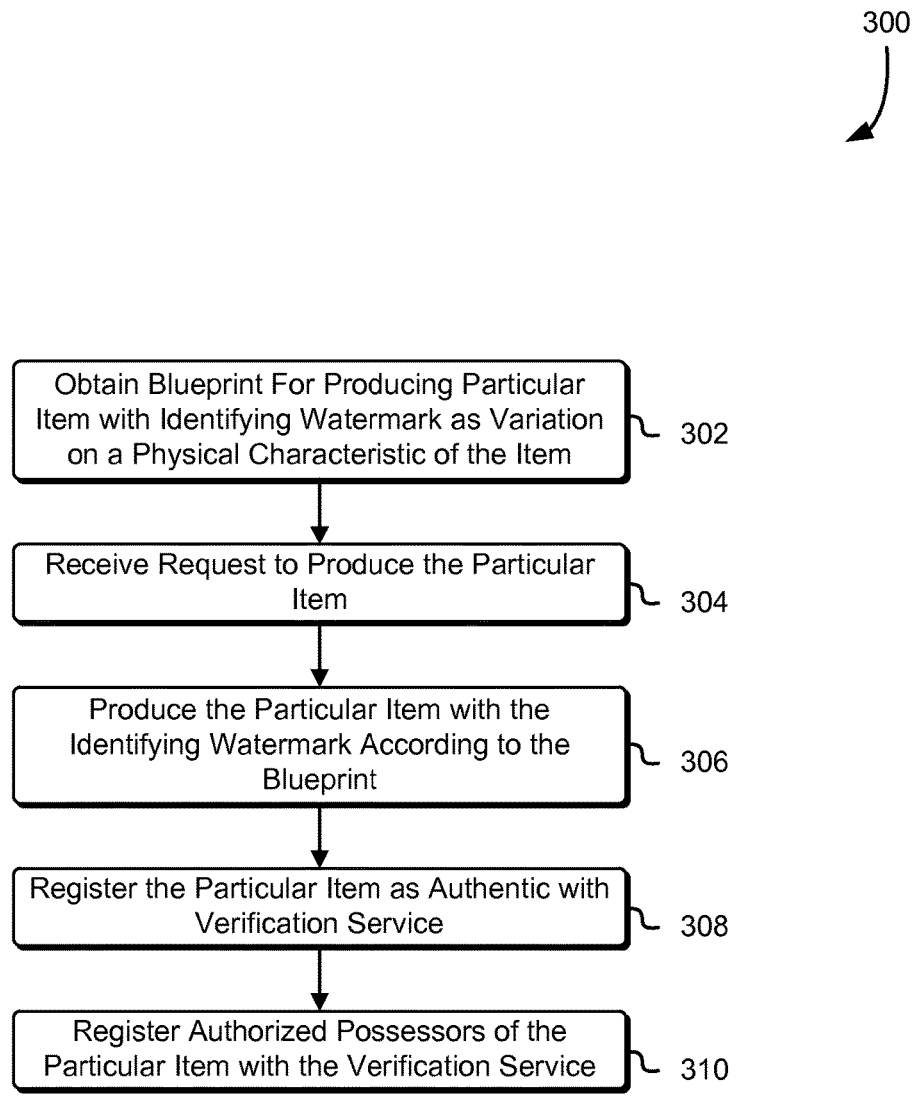
FIG. 3 is a block diagram that illustrates an example of producing a particular item in accordance with an embodiment.

FIG. 3 is a block diagram illustrating an example of a process 300 for producing an item with a watermark in accordance with various embodiments. The process 300 may be performed by any suitable system such as the on-demand manufacturing device 216 of FIG. 2 or any electronic client device such as the electronic client device 702 described in conjunction with FIG. 7. The process 300 includes a series of operations wherein a blueprint is used to produce a particular item with an identifying watermark, and the particular item, its identifying watermark, and its authorized possessors are registered with an authenticity verification service.

In 302, the system performing the process 300 obtains a blueprint containing instructions for producing an item. In some embodiments, this blueprint is an electronic file, such as a text file, eXtensible Markup Language file, or file with executable instructions, that provide instructions to a manufacturing device on how to produce the item. The blueprint may contain identifying information unique to the particular item being produced according to the blueprint, and this identifying information may be used at least in part to generate an identifying watermark for the particular item. Thus, in some embodiments the identifying information can be registered with an authenticity verification service in conjunction with the creation of the blueprint. In other embodiments, the identifying information can be registered in conjunction with producing the particular item in accordance with its blueprint. In some of these embodiments, other information, such as identifying information/metadata for the manufacturing device (e.g., serial number of the device, secret private key of the device, etc.), identifying information of an authorized possessor/owner, location of manufacture information, information indicating the type of particular item (e.g., handbag, scarf, shoes, action figure, etc.), and/or timestamp information is factored into generating and registering the watermark. That is, in some embodiments, such information is stored as registration information with the watermark. In other embodiments, such information is used to generate the watermark itself (e.g., a particular stitching pattern may represent a time, such as 8:51 PM, at which the particular item was manufactured, or an arrangement of shapes may represent a location, such as Paris, France, where the particular item was manufactured).

In 304, the system performing the process 300 may receive a request to produce the particular item according to the blueprint obtained in 302. As noted, in some implementations, the particular item may be an item produced by a three-dimensional printer. The particular item may be produced to comprise a variety of materials (e.g., plastics, ceramics, metals, etc.). In other implementations, the particular item may be an item produced by a textile-manufacturing machine, such as a computerized loom or sewing machine.

In 306, the manufacturing device may produce the particular item with an identifying watermark as described in the present disclosure. For example, the particular item may be a handbag produced to have a particular plaid pattern whose threads (e.g., color, location, orientation, thickness, distance from other threads, etc.) act as a watermark to distinguish that handbag from all other handbags. For example, the seller of the blueprint for the handbag may be a trademark holder who sells the blueprint to a customer to produce that particular handbag. The agreement between the seller and the customer may restrict the customer to only producing one handbag, and the blueprint may be pregenerated to have information for producing the watermark only for that particular handbag. Consequently, in some implementations, the blueprint may be configured to disable or delete itself after its particular item is produced/manufactured. In other implementations, the agreement between the seller and the customer may include authorization to produce multiple items. In some of these implementations, the blueprint may be generated by the seller to include information for producing multiple one-use watermarks for the items being produced.

In 308, the watermark for the particular item may be registered with an authenticity verification service. Registration for the particular item may include storing, in one or more data stores of the authenticity verification service, identifying information for the particular item that may be derived from scanning the watermark of the particular item. In embodiments, once a particular item is registered with the authenticity verification service, another item may not be registered with the same watermark. However, in some embodiments, the agreement between the seller and the customer can, under certain conditions, allow duplicate items to be produced to share the same watermark, such as in the event the original item is destroyed and a replacement item is needed.

As noted, in some embodiments, registration of the particular item and its watermark is performed by the authenticity verification service at a time when the blueprint for the particular item is generated. In other embodiments, registration of the particular item and its watermark occurs when the particular item is produced, such as through a request initiated by the manufacturing device to the authenticity verification service. For example, based on information about the type of object being produced (e.g., purse, pair of pants, bowling ball, etc.), an authenticity verification service may select a watermark location (i.e., where the watermark will be located on the object) and format of the watermark from a set of possible watermark locations and formats appropriate for the type of object. An item identifier may be generated to uniquely identify the item, and, in some embodiments, additional metadata, such as an identity of the on-demand manufacturing device, timestamp, and/or manufacturing location, may be factored into the generation of the item identifier. In some of these embodiments, the authenticity verification service factors some or all of the additional metadata into production of the item identifier (e.g., the blueprint may be generated only for use by a particular registered on-demand manufacturing device). In others of these embodiments, the authenticity verification service may provide a portion of the item identifier to the on-demand manufacturing device, and the on-demand manufacturing device may be configured to combine the portion of the item identifier with metadata (e.g., such as a serial number of the on-demand manufacturing device and a timestamp) to yield the complete item identifier.

The item identifier may then be integrated with the particular item as the watermark in the appropriate form and location. In other words, the item identifier values may be converted into physical characteristics (e.g., shapes, colors, patterns, etc.) as described in the present disclosure, which may then be integrated into the composition of the object as it is produced by the on-demand manufacturing device. In some embodiments, registration may occur at a time when the authenticity verification service generates the item identifier. In other embodiments, such as in some embodiments where the on-demand manufacturing device factors in additional metadata, such as its own identity or a timestamp, or where the on-demand manufacturing device determines characteristics of the watermark, such as a location of where to place the watermark, into the generation of the item identifier, registration may occur after or during production of the object. For example, the on-demand manufacturing device may communicate to the authenticity verification service with information for registering the item identifier/watermark. In still other embodiments, after the particular item is produced, the owner or other authorized possessor may scan the watermark with a scanning device, such as the scanning device 108 of FIG. 1, which can then communicate the scanned information to the authenticity verification service to register the item identifier/watermark in association with the object.

Finally, in 310, the owner and/or other authorized possessors may be registered with the authenticity verification service. Note that the operations of 610 may not be present in all embodiments. For example, in some embodiments, the authenticity verification service is only configured to register and verify the authenticity (i.e., genuineness) of particular items, and may be unconcerned with whether the possessor of the particular item is authorized to possess the particular item or not. In some embodiments, only the owner, and not additional authorized possessors, of the particular item can be registered in connection with the particular item. Note that one or more of the operations performed in 302-10 may be performed in various orders and combinations, including in parallel.

Figure 4:
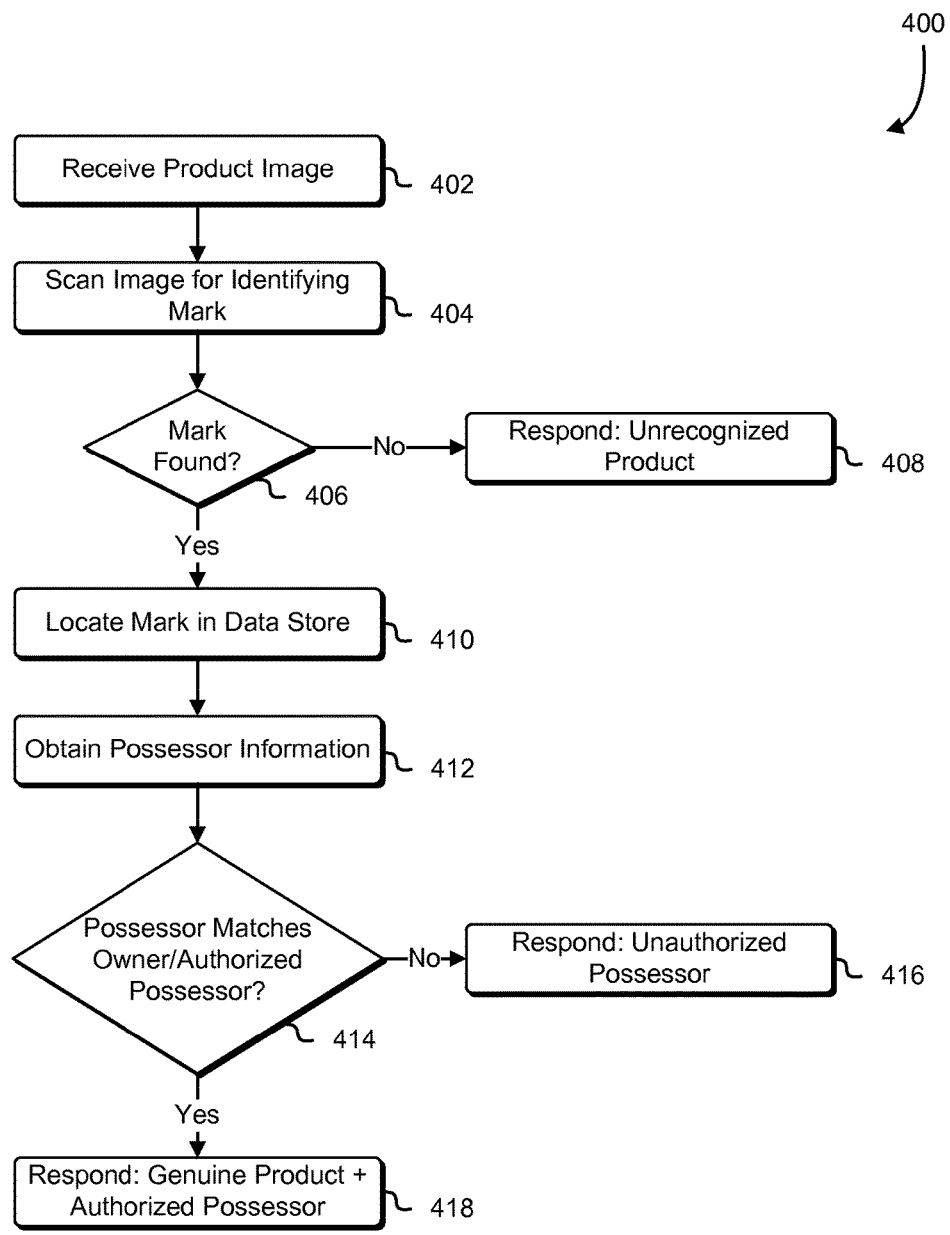
FIG. 4 is a flow chart that illustrates an example of performing authenticity verification using information about the product and the possessor in accordance with an embodiment.

FIG. 4 is a flow chart illustrating an example of a process 400 for verifying the authenticity of a particular item and its authorized possessor in accordance with various embodiments. The process 400 may be performed by any suitable system such as a server in a data center, multiple computing devices in a distributed system of a computing resource service provider, or any electronic client device such as the electronic client device 702 described in conjunction with FIG. 7. The process 400 includes a series of operations wherein an image of an item and an image of a possessor of the item is received, the image of the item is scanned for an identifying watermark, the possessor is identified, and the genuineness and whether the possessor is an authorized possessor is determined based at least in part on the watermark.

In 402, the system performing the process 400 may receive information relating to an item, such as a product that may be manufactured by an on-demand manufacturing device. The information may be received as a captured image of the item or as other descriptive information that may be analyzed for a watermark on the item. The information may be received from a scanning device, such as the scanning device 108 described in conjunction with FIG. 1. In 404, the received information may be analyzed to locate the watermark of the item within the received information, and the located watermark may be translated into identifying information (e.g., an item identifier) for the item. Note, in some embodiments, the identifying information is obtained, least in part, by the system performing the process 400 translating the watermark into the identifying information. In other embodiments, the identifying information is obtained, least in part, from a different computing device or a different service than the system performing the process 400 after the different computing device or different service translates the watermark into the identifying information. Note, in some embodiments, the scanning device 108 receives the information and perform the analysis itself, whereupon after translating the watermark, may provide the identifying information (e.g., an item identifier) to an authenticity verification service for performance of operations 410-18. Note too, that any information provided to and from an authenticity verification service may be provided securely, such as by symmetrically or asymmetrically encrypting the data at the sending end and appropriately decrypting the data at the receiving end.

In 406, the system performing the process 400 may determine whether it has detected and/or identified a watermark within the information received in 402. If the watermark was not detected and/or identified, the system performing the process 400 may proceed to 408, where a message to the effect of "Product not recognized" or "Could not find watermark; please rescan" may be displayed by a scanning device and/or sent to a scanning device. As noted, in some implementations, the operations of 406-08 may be performed by a scanning device, and if the scanning device is able to locate and translate a watermark, the scanning device may provide the identifying information to an authenticity verification service that may perform the operations of 410-18.

If identifying information was obtained from a scanned watermark, the system performing the process 400 may proceed to 410, whereupon the identifying information may be used to locate the respective item's registration information in a data store of the authenticity verification service. Registration information may include information such as the identifying information (e.g., identifier) of the item, location where the item was manufactured, identity of the manufacturing device, date and time of manufacture, date and time of registration, and information identifying authorized owners and possessors.

In 412, the system performing the process 400 may attempt to determine an identity of the present possessor of the item. Note that possessor verification may not be present in all embodiments of the present disclosure, and as such, operations in 412-16 may be omitted from such embodiments. The identity of the possessor may be obtained by scanning the same image of the item from 402 for the presence of the possessor, such as by running the image through a facial recognition algorithm. Alternatively, a separate image of the possessor may be captured.

Other methods include scanning an audio recording for voice recognition, entering the possessor's name into the scanning device through an input component, scanning a fingerprint, or otherwise providing identifying information into the scanning device or authenticity verification service.

In 414, the identity of the possessor may be compared against a registered set of authorized possessors of the item in a data store of the authenticity verification service. If the identity of the possessor does not match an authorized possessor, the system performing the process 400 may proceed to 416 and respond with a message to the effect that, "Possessor could not be confirmed as authorized to possess the item." Note that in optical recognition cases, if a scanned image is of such a quality that the system performing the process 400 is unable to detect the possessor, the system performing the process 400 may also proceed to 416, whereupon a message to the effect that "Possessor could not be recognized; please try again" may be displayed. Note too, that in cases where the possessor is detected but not authorized, the system performing the process 400 may not have record of the possessor in its data store, and may similarly respond with "Possessor could not be verified as an authorized possessor."

However, if the identity of the possessor does match an identity of an authorized possessor, the system performing the process 400 may proceed to 418, whereupon a message may be displayed to the effect that, "Item is confirmed as an authentic item. Possessor is confirmed as an authorized possessor of the authentic item." Note that one or more of the operations performed in 402-18 may be performed in various orders and combinations, including in parallel.

Figure 5:
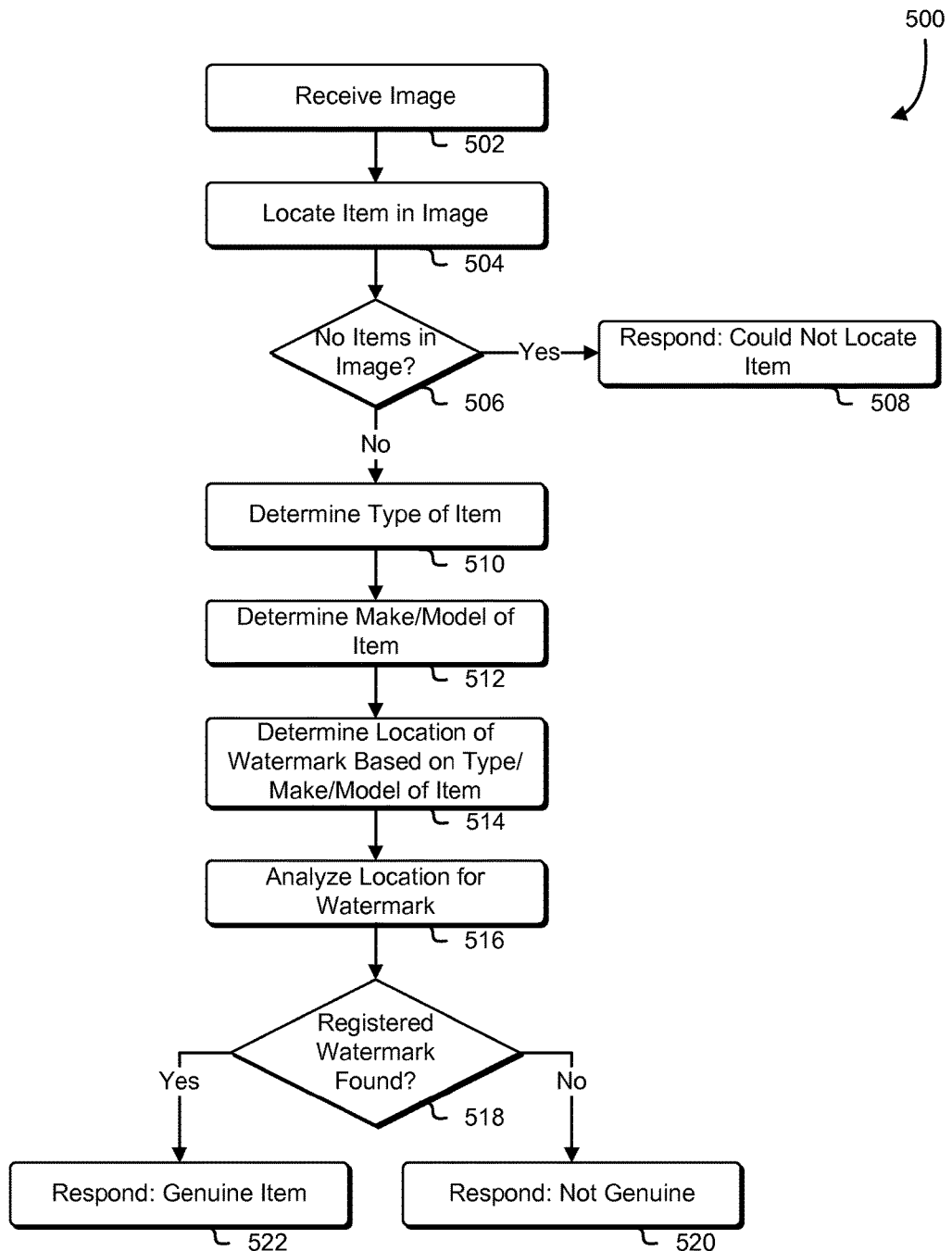
FIG. 5 is a flow chart that illustrates an example of item identification in accordance with an embodiment.

FIG. 5 is a block diagram illustrating an example of a process 500 for identifying a watermark in accordance with various embodiments. The process 500 may be performed by any suitable system such as a server in a data center, multiple computing devices in a distributed system of a computing resource service provider, the scanning device 108 of FIG. 1, or any electronic client device such as the electronic client device 702 described in conjunction with FIG. 7. The process 500 includes a series of operations wherein an image of an item is received, the item is identified, and its watermark is located and analyzed.

In 502, an image is received, such as from a scanning device or other image capture device. The image may be received in a variety of formats, including bitmap, Joint Photographic Experts Group (JPEG), Portable Network Graphics (PNG), and Graphics Interchange (GIF) formats. In 504, the system performing the process 500 may scan the image to attempt to recognize one or more items/objects within the image. Objects may be recognized within the image using one or more of a variety of techniques, such as edge matching (e.g., Canny edge detection, etc.), divide-and-conquer search, greyscale matching, gradient matching, interpretation trees, pose consistency, pose clustering, geometric hashing, scale-invariant feature transform (SIFT), and speeded up robust features (SURF).

If, in 506 it is determined that no items could be identified in the image, the system performing the process 500 may proceed to 508 wherein the system responds with a message that no items could be located in the image and processing terminates. Otherwise, if at least one item was detected in the image, the system performing the process may proceed to 510, wherein the system may attempt to determine the type of item located. Note that if the type of item (e.g., shirt, shoes, toy car, suitcase, wristwatch, etc.) is unable to be determined, the system performing the process 500 may respond with a message that the item in the image is an unknown type of item type.

Once the type of item is determined, in 512, the system performing the process 500 may attempt to determine the make and/or model of the item. That is, based on shape and style of the item in the image, the system performing the process may be able to determine, from a data store of exemplar items, a make and/or model of the item. Additionally or alternatively, the system performing the process 500 may also scan the region of the image occupied by the recognized item for a particular logo and/or perform optical character recognition on the region in order to determine the brand and/or model of the item. As an example, the item may have been determined in 510 to be a jacket with a particular squiggly logo on the right shoulder. Using such information, with reference to model or other exemplar data in a data store, the system performing the process 500 may determine that the jacket is a brand of jacket by Company X. With additional reference to the data store, the system performing the process 500 may further determine that the jacket is a Model L Winter Jacket by Company X. Based on the information determined about the item in 510-12, in 514 the system performing the process 500 may, with reference to a data store of a authenticity verification service, determine one or more locations where a watermark of the type described in the present disclosure may be located on the item and the format of the watermark (e.g., an arrangement of a pattern, threads, colors, etc.).

For example, the identifying information of Company X's Model L Winter Jacket may relate to the spacing between red and white threads in the shoulder region of the jacket. Conversely, the identifying information of Company Y's Polar Parka may relate to an arrangement of colors in a band at the waist. Such information usable for detecting and interpreting the watermark may be stored by the authenticity verification service in a data store, and linked to the various trademark holders. The authenticity verification service may provide the trademark holders with an interface, such as a personalized website dashboard, that may be used to specify such watermark location and watermark format information for the specific types of the trademark holders' products. Once the location and format of the watermark is known, in 516, the system performing the process 500 may analyze the image for the watermark. As noted, filtering and error correction algorithms may be utilized on the image to render the watermark readable by the system (e.g., the item in the image may be blurry, viewed at an angle, partially obscured, etc.).

In 518, a determination may be made whether the watermark could be found and read by the system. If the watermark on the item could not be found and/or interpreted, the system performing the process may be proceed to 520, whereupon the system performing the process 500 may respond in 520 with a message that the watermark could not be found or interpreted, which may indicate that the item is not a genuine item of the type that would be registered with an authenticity verification service. Otherwise, if the watermark could be located and interpreted, in 522, the system performing the process 500 may respond that the item has been identified as an item registered as authentic with the authenticity verification service. Note that the operations of 504-22 may be repeated for each detected item in the image. Note also that one or more of the operations performed in 502-22 may be performed in various orders and combinations, including in parallel.

Figure 6:
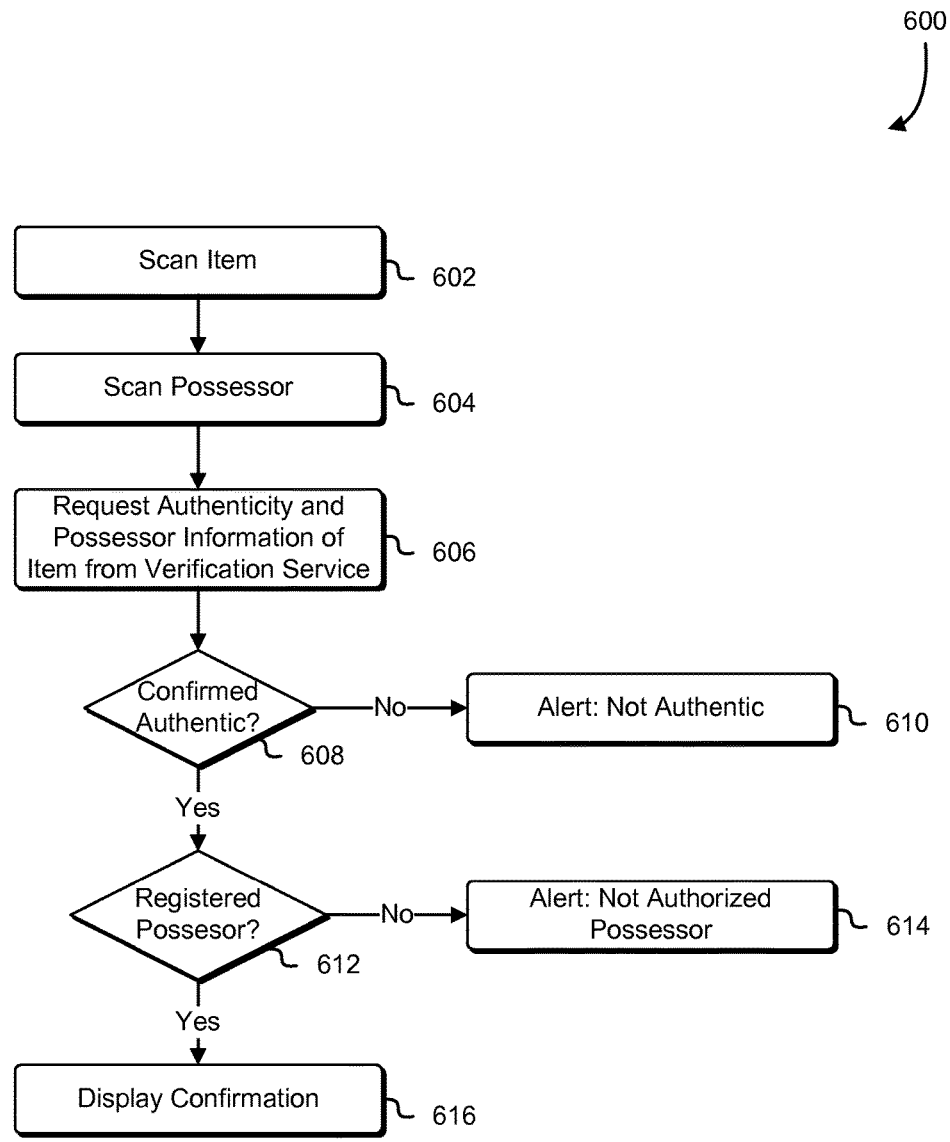
FIG. 6 is a flow chart that illustrates an example of scanning an item and possessor for authenticity verification in accordance with an embodiment.

FIG. 6 is a flow chart illustrating an example of a process 600 for confirming authenticity and possessorship of an item and with a scanning device in accordance with various embodiments. The process 600 may be performed by any suitable system such the scanning device 108 of FIG. 1 or any electronic client device such as the electronic client device 702 described in conjunction with FIG. 7. The process 600 includes a series of operations wherein an item and its possessor is scanned, authenticity and possessor confirmation is requested from an authenticity verification service, and the results of the confirmation are displayed.

In 602, the item is scanned by a scanning device such as the scanning device 108 of FIG. 1. In some embodiments, the scan takes the form of capturing an image of the item. In some of these embodiments, the scan additionally includes analyzing the information for a watermark and translating the watermark into identifying information that may be used to locate the item in a data store of an authenticity verification service. Alternatively, in some embodiments, scanning the item is performed in a manner similar to a barcode reader; for example, a plaid pattern may be scanned to detect color, thickness, position, and spacing of the threads in the pattern to glean identifying information from the pattern. Detection mechanisms may vary based on the type of watermark utilized. For example, a scanning device may include a microphone for receiving audible watermark data (e.g., frequency patterns, tones made by the item when tapped or squeezed). As another example, a scanning device may include one or more chemosensors for detecting odors or other chemical fingerprints emanating from the item.

In 604, the scanning device may scan, or otherwise obtain identifying information of, the possessor of the item. Similar to the operations of 602, in some embodiments the scanning device captures an image of the possessor. In still other embodiments, the scanning device captures both the item and the possessor in a single captured image. Still other types of identifying information may be obtained about the possessor, such as voice information, fingerprint information, and secret knowledge information (e.g., username and password supplied by the possessor).

In 606, such data captured from the item and possessor may be provided to an authenticity verification service. In some embodiments, the data, such as captured images of the item and its possessor are provided to the authenticity verification service without analysis by the scanning device. In other embodiments, prior to providing data to the authenticity verification service, facial recognition analysis is performed on data captured from the possessor and watermark analysis may be performed on data captured from the item by the scanning device, and the resulting data may then be supplied to the authenticity verification service.

In 608, the authenticity verification service may respond with a verification result on the authenticity of the item based on the data about the item provided to the authenticity verification system by the system performing the process 600. Alternatively, in some embodiments, the system performing the process 600 (e.g., the scanning device) performs the authenticity verification itself (e.g., making database queries, comparing the present possessor against authorized possessors, etc.) in the manner described in FIG. 4. In either case, if the verification result is that the item is confirmed to not be authentic, or, alternatively, could not be confirmed to be authentic, the system performing the process 600 may proceed to 610 and respond with an alert (e.g., message, graphic, audible tone, etc.) indicating that the device could not be confirmed as authentic. In some embodiments, this alert includes notifying proper authorities (e.g., law enforcement, trademark holder, etc.) that an inauthentic item masquerading as an authentic item was detected. Such an alert may include information as to the time and place that the inauthentic item was discovered and any information obtained about the possessor (e.g., confirmed identity, captured images, voice patterns, etc.) of the item.

Otherwise, if the item is confirmed to be authentic, the system performing the process 600 may proceed to 612, whereupon information may be received from an authenticity verification system regarding the possessorship of the item in response to the data regarding the present possessor provided to the authenticity verification service by the system performing the process 600. Alternatively, as noted, in some embodiments the system performing the process 600 itself (e.g., the scanning device) performs the possessorship verification itself in the manner described in FIG. 4. In either case, if the result is that the present possessor could not be identified or if the present possessor was identified as not being an authorized possessor, the system performing the process 600 may proceed to 614 and respond with an alert (e.g., message, graphic, audible tone, etc.) indicating that the possessor could not be confirmed as an authorized possessor. In some embodiments, this alert includes notifying proper authorities (law enforcement, trademark holder, registered owner, etc.) that a registered item was found in the possession of an individual not authorized to possess it. Such an alert may additionally include information as to the time and place the item was discovered in the possession of the unauthorized possessor and any information obtained about the possessor (e.g., images of the possessor, voice recordings of the possessor, etc.).

Otherwise, if the possessor was confirmed as an authorized possessor and the item was confirmed as an authentic item, in 616, the system performing the process 600 may respond with a confirmation (e.g., message, graphic, audible tone, etc.) indicating that the item is confirmed as authentic and that the present possessor is registered as authorized to possess the authentic item. Note that in some embodiments, possessorship is not be a feature provided by the system performing the process 600, and in such cases the operations of 612-14 may be omitted. Note too that one or more of the operations performed in 602-16 may be performed in various orders and combinations, including in parallel.

Note that, unless otherwise specified, use of expressions regarding executable instructions (also referred to as code, applications, agents, etc.) performing operations that instructions do not ordinarily perform unaided (e.g., transmission of data, calculations, etc.) in the context of describing disclosed embodiments denote that the instructions are being executed by a machine, thereby causing the machine to perform the specified operations.

Figure 7:
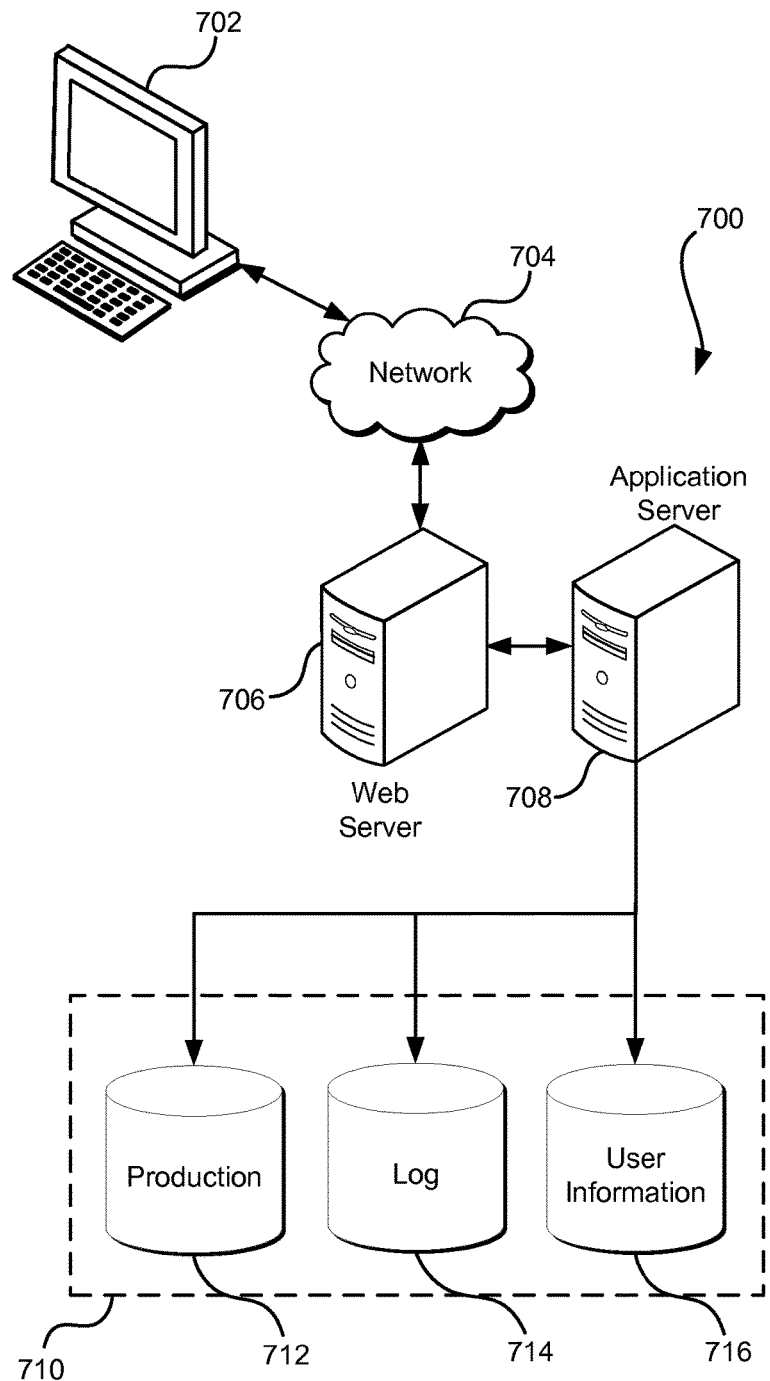
FIG. 7 illustrates an environment in which various embodiments can be implemented.

FIG. 7 illustrates aspects of an example environment 700 for implementing aspects in accordance with various embodiments. As will be appreciated, although a web-based environment is used for purposes of explanation, different environments may be used, as appropriate, to implement various embodiments. The environment includes an electronic client device 702, which can include any appropriate device operable to send and/or receive requests, messages or information over an appropriate network 704 and, in some embodiments, convey information back to a user of the device. Examples of such client devices include personal computers, cell phones, handheld messaging devices, laptop computers, tablet computers, set-top boxes, personal data assistants, embedded computer systems, electronic book readers, and the like. The network can include any appropriate network, including an intranet, the Internet, a cellular network, a local area network, a satellite network or any other network and/or combination thereof. Components used for such a system can depend at least in part upon the type of network and/or environment selected. Protocols and components for communicating via such a network are well known and will not be discussed in detail. Communication over the network can be enabled by wired or wireless connections and combinations thereof. In this example, the network includes the Internet, as the environment includes a web server 706 for receiving requests and serving content in response thereto, although for other networks an alternative device serving a similar purpose could be used as would be apparent to one of ordinary skill in the art.

The illustrative environment includes an application server 708 and a data store 710. It should be understood that there could be several application servers, layers or other elements, processes or components, which may be chained or otherwise configured, which can interact to perform tasks such as obtaining data from an appropriate data store. Servers, as used, may be implemented in various ways, such as hardware devices or virtual computer systems. In some contexts, servers may refer to a programming module being executed on a computer system. As used, unless otherwise stated or clear from context, the term "data store" refers to any device or combination of devices capable of storing, accessing and retrieving data, which may include any combination and number of data servers, databases, data storage devices and data storage media, in any standard, distributed, virtual or clustered environment. The application server can include any appropriate hardware, software and firmware for integrating with the data store as needed to execute aspects of one or more applications for the client device, handling some or all of the data access and business logic for an application. The application server may provide access control services in cooperation with the data store and is able to generate content including, text, graphics, audio, video and/or other content usable to be provided to the user, which may be served to the user by the web server in the form of HyperText Markup Language ("HTML"), Extensible Markup Language ("XML"), JavaScript, Cascading Style Sheets ("CSS"), or another appropriate client-side structured language. Content transferred to a client device may be processed by the client device to provide the content in one or more forms including, forms that are perceptible to the user audibly, visually and/or through other senses including touch, taste, and/or smell. The handling of all requests and responses, as well as the delivery of content between the electronic client device 702 and the application server 708, can be handled by the web server using PHP: Hypertext Preprocessor ("PHP"), Python, Ruby, Perl, Java, HTML, XML, or another appropriate server-side structured language in this example. It should be understood that the web and application servers are not required and are merely example components, as structured code discussed can be executed on any appropriate device or host machine as discussed elsewhere. Further, operations described as being performed by a single device may, unless otherwise clear from context, be performed collectively by multiple devices, which may form a distributed and/or virtual system.

The data store 710 can include several separate data tables, databases, data documents, dynamic data storage schemes and/or other data storage mechanisms and media for storing data relating to a particular aspect of the present disclosure. For example, the data store illustrated may include mechanisms for storing production data 712 and user information 716, which can be used to serve content for the production side. The data store also is shown to include a mechanism for storing log data 714, which can be used for reporting, analysis or other purposes. It should be understood that there can be many other aspects that may need to be stored in the data store, such as page image information and access rights information, which can be stored in any of the above listed mechanisms as appropriate or in additional mechanisms in the data store 710. The data store 710 is operable, through logic associated therewith, to receive instructions from the application server 708 and obtain, update or otherwise process data in response thereto. The application server 708 may provide static, dynamic or a combination of static and dynamic data in response to the received instructions. Dynamic data, such as data used in web logs (blogs), shopping applications, news services and other applications may be generated by server-side structured languages as described or may be provided by a content management system ("CMS") operating on, or under the control of, the application server. In one example, a user, through a device operated by the user, might submit a search request for a certain type of item. In this case, the data store might access the user information to verify the identity of the user and can access the catalog detail information to obtain information about items of that type. The information then can be returned to the user, such as in a results listing on a web page that the user is able to view via a browser on the electronic client device 702. Information for a particular item of interest can be viewed in a dedicated page or window of the browser. It should be noted, however, that embodiments of the present disclosure are not necessarily limited to the context of web pages, but may be more generally applicable to processing requests in general, where the requests are not necessarily requests for content.

Each server typically will include an operating system that provides executable program instructions for the general administration and operation of that server and typically will include a computer-readable storage medium (e.g., a hard disk, random access memory, read only memory, etc.) storing instructions that, when executed by a processor of the server, allow the server to perform its intended functions. Suitable implementations for the operating system and general functionality of the servers are known or commercially available and are readily implemented by persons having ordinary skill in the art, particularly in light of the disclosure.

The environment, in one embodiment, is a distributed and/or virtual computing environment utilizing several computer systems and components that are interconnected via communication links, using one or more computer networks or direct connections. However, it will be appreciated by those of ordinary skill in the art that such a system could operate equally well in a system having fewer or a greater number of components than are illustrated in FIG. 7. Thus, the depiction of the example environment 700 in FIG. 7 should be taken as being illustrative in nature and not limiting to the scope of the disclosure.

The various embodiments further can be implemented in a wide variety of operating environments, which in some cases can include one or more user computers, computing devices or processing devices that can be used to operate any of a number of applications. User or client devices can include any of a number of general purpose personal computers, such as desktop, laptop or tablet computers running a standard operating system, as well as cellular, wireless and handheld devices running mobile software and capable of supporting a number of networking and messaging protocols. Such a system also can include a number of workstations running any of a variety of commercially available operating systems and other known applications for purposes such as development and database management. These devices also can include other electronic devices, such as dummy terminals, thin-clients, gaming systems and other devices capable of communicating via a network. These devices also can include virtual devices such as virtual machines, hypervisors and other virtual devices capable of communicating via a network.

Various embodiments of the present disclosure utilize a network that would be familiar to those skilled in the art for supporting communications using any of a variety of commercially-available protocols, such as Transmission Control Protocol/Internet Protocol ("TCP/IP"), User Datagram Protocol ("UDP"), protocols operating in various layers of the Open System Interconnection ("OSI") model, File Transfer Protocol ("FTP"), Universal Plug and Play ("UpnP"), Network File System ("NFS"), Common Internet File System ("CIFS") and AppleTalk. The network can be, for example, a local area network, a wide-area network, a virtual private network, the Internet, an intranet, an extranet, a public switched telephone network, an infrared network, a wireless network, a satellite network, and any combination thereof.

In embodiments utilizing a web server, the web server can run any of a variety of server or mid-tier applications, including Hypertext Transfer Protocol ("HTTP") servers, FTP servers, Common Gateway Interface ("CGI") servers, data servers, Java servers, Apache servers, and business application servers. The server(s) also may be capable of executing programs or scripts in response to requests from user devices, such as by executing one or more web applications that may be implemented as one or more scripts or programs written in any programming language, such as Java®, C, C# or C++, or any scripting language, such as Ruby, PHP, Perl, Python or TCL, as well as combinations thereof. The server(s) may also include database servers, including those commercially available from Oracle®, Microsoft®, Sybase®, and IBM® as well as open-source servers such as MySQL, Postgres, SQLite, MongoDB, and any other server capable of storing, retrieving, and accessing structured or unstructured data. Database servers may include table-based servers, document-based servers, unstructured servers, relational servers, non-relational servers or combinations of these and/or other database servers.

The environment can include a variety of data stores and other memory and storage media as discussed above. These can reside in a variety of locations, such as on a storage medium local to (and/or resident in) one or more of the computers or remote from any or all of the computers across the network. In a particular set of embodiments, the information may reside in a storage-area network ("SAN") familiar to those skilled in the art. Similarly, any necessary files for performing the functions attributed to the computers, servers or other network devices may be stored locally and/or remotely, as appropriate. Where a system includes computerized devices, each such device can include hardware elements that may be electrically coupled via a bus, the elements including, for example, a central processing unit ("CPU" or "processor"), an input device (e.g., a mouse, keyboard, controller, touch screen or keypad), and an output device (e.g., a display device, printer or speaker). Such a system may also include one or more storage devices, such as disk drives, optical storage devices and solid-state storage devices such as random access memory ("RAM") or read-only memory ("ROM"), as well as removable media devices, memory cards, flash cards, etc.

Such devices also can include a computer-readable storage media reader, a communications device (e.g., a modem, a wireless or wired network card, an infrared communication device, etc.), and working memory as described above. The computer-readable storage media reader can be connected with, or configured to receive, a computer-readable storage medium, representing remote, local, fixed, and/or removable storage devices as well as storage media for temporarily and/or more permanently containing, storing, transmitting, and retrieving computer-readable information. The system and various devices also typically will include a number of software applications, modules, services, or other elements located within a working memory device, including an operating system and application programs, such as a client application or web browser. It should be appreciated that alternate embodiments may have numerous variations from that described above. For example, customized hardware might also be used and/or particular elements might be implemented in hardware, software (including portable software, such as applets) or both. Further, connection to other computing devices such as network input/output devices may be employed.

Storage media and computer readable media for containing code, or portions of code, can include any appropriate media known or used in the art, including storage media and communication media, such as, volatile and non-volatile, removable and non-removable media implemented in any method or technology for storage and/or transmission of information such as computer readable instructions, data structures, program modules or other data, including RAM, ROM, Electrically Erasable Programmable Read-Only Memory ("EEPROM"), flash memory or other memory technology, Compact Disc Read-Only Memory ("CD-ROM"), digital versatile disk (DVD) or other optical storage, magnetic cassettes, magnetic tape, magnetic disk storage or other magnetic storage devices or any other medium which can be used to store the desired information and which can be accessed by the system device. Based on the disclosure and teachings provided, a person of ordinary skill in the art will appreciate other ways and/or methods to implement the various embodiments.

The specification and drawings are, accordingly, to be regarded in an illustrative rather than a restrictive sense. However, it will be evident that various modifications and changes may be made thereunto without departing from the broader spirit and scope of the invention as set forth in the claims.

Other variations are within the spirit of the present disclosure. Thus, while the techniques are susceptible to various modifications and alternative constructions, certain illustrated embodiments thereof are shown in the drawings and have been described above in detail. It should be understood, however, that there is no intention to limit the invention to the specific form or forms disclosed, but on the contrary, the intention is to cover all modifications, alternative constructions and equivalents falling within the spirit and scope of the invention, as defined in the appended claims.

The use of the terms "a," "an," and "the" and similar referents in the context of describing the embodiments (especially in the context of the following claims) are to be construed to cover both the singular and the plural, unless otherwise indicated or clearly contradicted by context. The terms "comprising," "having," "including" and "containing" are to be construed as open-ended terms (i.e., meaning "including, but not limited to,") unless otherwise noted. The term "connected," when unmodified and referring to physical connections, is to be construed as partly or wholly contained within, attached to or joined together, even if there is something intervening. Recitation of ranges of values are merely intended to serve as a shorthand method of referring individually to each separate value falling within the range, unless otherwise indicated and each separate value is incorporated into the specification as if it were individually recited. The use of the term "set" (e.g., "a set of items") or "subset" unless otherwise noted or contradicted by context, is to be construed as a nonempty collection comprising one or more members. Further, unless otherwise noted or contradicted by context, the term "subset" of a corresponding set does not necessarily denote a proper subset of the corresponding set, but the subset and the corresponding set may be equal.

Conjunctive language, such as phrases of the form "at least one of A, B, and C," or "at least one of A, B and C," is understood with the context as used in general to present that an item, term, etc., may be either A or B or C, or any nonempty subset of the set of A and B and C, unless specifically stated otherwise or otherwise clearly contradicted by context. For instance, in the illustrative example of a set having three members, the conjunctive phrases "at least one of A, B, and C" and "at least one of A, B and C" refer to any of the following sets: {A}, {B}, {C}, {A, B}, {A, C}, {B, C}, {A, B, C}. Thus, such conjunctive language is not generally intended to imply that certain embodiments require at least one of A, at least one of B and at least one of C each to be present.

Operations of processes described can be performed in any suitable order unless otherwise indicated or otherwise clearly contradicted by context. Processes described (or variations and/or combinations thereof) may be performed under the control of one or more computer systems configured with executable instructions and may be implemented as code (e.g., executable instructions, one or more computer programs or one or more applications) executing collectively on one or more processors, by hardware or combinations thereof. The code may be stored on a computer-readable storage medium, for example, in the form of a computer program comprising instructions executable by one or more processors. The computer-readable storage medium may be non-transitory.

The use of any examples, or exemplary language (e.g., "such as") provided, is intended merely to better illuminate embodiments of the invention and does not pose a limitation on the scope of the invention unless otherwise claimed. No language in the specification should be construed as indicating any non-claimed element as essential to the practice of the invention.

Embodiments of this disclosure are described, including the best mode known to the inventors for carrying out the invention. Variations of those embodiments may become apparent to those of ordinary skill in the art upon reading the foregoing description. The inventors expect skilled artisans to employ such variations as appropriate and the inventors intend for embodiments of the present disclosure to be practiced otherwise than as specifically described. Accordingly, the scope of the present disclosure includes all modifications and equivalents of the subject matter recited in the claims appended hereto as permitted by applicable law. Moreover, any combination of the above-described elements in all possible variations thereof is encompassed by the scope of the present disclosure unless otherwise indicated or otherwise clearly contradicted by context.

All references, including publications, patent applications, and patents, cited are hereby incorporated by reference to the same extent as if each reference were individually and specifically indicated to be incorporated by reference and were set forth in its entirety.

What is claimed is:

1. A computer-implemented method, comprising:
    obtaining a request to produce a particular physical item;
    determining a watermark to operate as an identifier for the particular physical item, the watermark being producible by varying a physical characteristic that is integrated into composition of the particular physical item in a manner that is readable by a computing device but unreadable by an individual;
    producing, using a printer, both the particular physical item and the watermark such that the watermark is camouflaged within a visible spectrum of an exposed pattern of the particular physical item; and
    causing the watermark and at least one possessor to be registered with an authenticity verification service of a computing resource service provider in association with the particular physical item, thereby identifying the particular physical item as an authentic item and identifying the at least one possessor as authorized to possess the authentic item, at least by providing an image of the particular physical item to the authenticity verification service, the image including the watermark and usable by the authenticity verification service to:
        recognize an item type of the particular physical item in the image;
        locate the watermark in the image based at least in part on the item type of the particular physical item;
        identify an item identifier based at least in part on the watermark; and
        register the at least one possessor in association with the item identifier.

2. The computer-implemented method of claim 1, wherein the printer is a printer that fabricates three-dimensional objects.

3. The computer-implemented method of claim 1, further comprising:
    scanning, with a scanning device, the particular physical item for data about the particular physical item;
    identifying the watermark of the particular physical item from the data; and
    verifying that the particular physical item is authentic based at least in part on determining that the watermark of the particular physical item has been registered with the authenticity verification service.

4. The computer-implemented method of claim 1, wherein at least a portion of the watermark is imperceptible to unaugmented human senses.

5. A system, comprising:
    one or more processors; and
    memory including instructions that, as a result of execution by the one or more processors, cause the system to:
        determine, from a particular item that has been produced by a printer, a watermark that is comprised of one or more variations of a set of characteristics camouflaged within a visible spectrum of an exposed pattern of the particular item by the printer, at least in part by causing the system to:
            obtain an image of the particular item;
            recognize an item type of the particular item;

determine watermark location information, based at least in part on the item type; and locate the watermark in the image based at least in part on the watermark location information;

determine, using the watermark determined, authenticity of the particular item and authorized possessorship for the particular item based at least in part on the watermark having been registered as an authentic item and at least one possessor having been registered as authorized to possess the authentic item; and provide an indication that the watermark corresponds to the authentic item and an indication of possessor status of the particular item.

6. The system of claim 5, wherein the set of characteristics includes at least one of:

sizes of one or more components of the particular item, spacings between one or more components of the particular item, colors of one or more components of the particular item, or one or more patterns on the particular item.

7. The system of claim 5, wherein the instructions further include instructions that cause the system to:

receive a request to update authorized possessor information for the particular item to indicate a particular individual as authorized to possess the particular item; and in response to the request to update the authorized possessor information, submit, through an application programming interface provided by an authenticity verification service, a request for the authenticity verification service to register the particular individual as a new authorized possessor for the particular item.

8. The system of claim 5, wherein the watermark is readable by the system but unreadable by an individual.

9. The system of claim 5, wherein the set of characteristics include characteristics that are imperceptible to unaugmented human senses.

10. The system of claim 9, wherein the characteristics that are imperceptible to unaugmented human senses include one or more of:

a characteristic that is only detectable under ultraviolet spectrum, a characteristic that is only detectable under infrared spectrum, a pattern that is created at least in part as a result of body heat, an impression that is too small to an unaugmented human eye to be readable unaided, or a sound that is emitted at a frequency outside a range of unaugmented human hearing.

11. The system of claim 5, wherein the system is of a type selected from a group consisting of optical scanning devices, mobile telephones with one or more image sensors, and wearable computing devices.

12. The system of claim 11, wherein the system has a display that is modified to reflect the indication that the watermark determined corresponds to the authentic item and the indication of possessor status.

13. A non-transitory computer-readable storage medium having stored thereon executable instructions that, as a result of execution by one or more processors of a computer system, cause the computer system to at least:

receive a request to determine a watermark for a particular item to be produced, the request including metadata about the particular item;

select a watermark format from a set of watermark formats based at least in part on the metadata;

determine at least a portion of an item identifier for the particular item by at least causing the computer system to:

receive an image of the particular item;

recognize an item type of the particular item in the image;

determine watermark location information and watermark format information for the particular item based at least in part on the item type of the particular item;

locate the watermark in the image based at least in part on the watermark location information; and obtain the item identifier based at least in part on the watermark and the watermark format information;

register, with an authenticity verification service, the watermark in association with the particular item, the registration providing an indication that the particular item is an authentic item; and register, with the authenticity verification service, a set of identities for one or more authorized possessors of the particular item.

14. The non-transitory computer-readable storage medium of claim 13, wherein the executable instructions further include instructions that cause the computer system to receive a request to provide an indication whether a present possessor is an authorized possessor, the request including identifying information about the present possessor of the particular item.

15. The non-transitory computer-readable storage medium of claim 13, wherein the watermark in the image is readable by the computer system but unreadable by an individual.

16. The non-transitory computer-readable storage medium of claim 13, wherein the particular item is an item produced by an on-demand manufacturing device according to a blueprint containing instructions to the on-demand manufacturing device for producing the particular item with a watermark corresponding to the item identifier.

17. The non-transitory computer-readable storage medium of claim 16, wherein the on-demand manufacturing device is caused to produce the watermark for the particular item such that the watermark is unique to the particular item.

18. The non-transitory computer-readable storage medium of claim 17, wherein the blueprints are generated by a third party to contain information for producing a watermark for the particular item that is registered with an authenticity verification service as corresponding to the particular item.

19. The non-transitory computer-readable storage medium of claim 17, wherein the on-demand manufacturing device is configured to generate the watermark and register the watermark with an authenticity verification service in association with the particular item.

20. The non-transitory computer-readable storage medium of claim 13, wherein the watermark appears as a particular arrangement of a pattern on the particular item.

* * * * *